(12) United States Patent
Sheng et al.

(10) Patent No.: US 6,259,304 B1
(45) Date of Patent: Jul. 10, 2001

(54) REAL-TIME STANDBY VOLTAGE ADJUSTMENT CIRCUIT

(75) Inventors: Tony Sheng; Brad Hsu; Zane Chen, all of Taipei Hsien (TW)

(73) Assignee: Kinpo Electronics, Inc., Taipei (TW)

( * ) Notice: Subject to any disclaimer, the term of this patent is extended or adjusted under 35 U.S.C. 154(b) by 0 days.

(21) Appl. No.: 09/472,786

(22) Filed: Dec. 28, 1999

(51) Int. Cl.[7] .................................................. H03K 17/62
(52) U.S. Cl. ................................. 327/408; 327/541
(58) Field of Search ........................ 326/80, 81; 327/407, 327/408, 409, 410, 411, 412, 413, 538, 540, 541

(56) References Cited

U.S. PATENT DOCUMENTS

| | | | | |
|---|---|---|---|---|
| 5,157,291 | * | 10/1992 | Shimoda | 307/573 |
| 5,530,398 | * | 6/1996 | Shamlou et al. | 327/545 |
| 5,570,061 | * | 10/1996 | Shimoda | 327/545 |
| 5,886,561 | * | 3/1999 | Eitan et al. | 327/408 |
| 6,035,358 | * | 3/2000 | Tanikawa | 710/102 |

* cited by examiner

*Primary Examiner*—Jeffrey Zweizig
(74) *Attorney, Agent, or Firm*—Bacon & Thomas, PLLC

(57) ABSTRACT

A real-time standby voltage adjustment circuit includes a switch control circuit controlled by a power saving control signal provided by a personal computer for generating a switch signal. A switch device is controlled by the switch signal for receiving a working voltage provided by a power supply of the personal computer and selectively outputting the same. A converting control circuit receives an adjust voltage signal generated by an adjustment and switch circuit. The converting control circuit is controlled by the power saving control signal for applying the adjust voltage signal back to the adjustment and switch circuit thereby controlling the adjustment and switch circuit to adjust a standby voltage provided by the power supply and output an adjusted standby voltage.

8 Claims, 3 Drawing Sheets

REAL-TIME STANDBY VOLTAGE ADJUSTMENT CIRCUIT

BACKGROUND OF THE INVENTION

1. Field of the Invention

The present invention relates to the field of personal computers and, more particularly, to a real-time standby voltage adjustment circuit for controlling the power saving modes of personal computers.

2. Description of Related Art

Conventionally, a power saving feature is available in the motherboard of a personal computer (PC) for saving power when the PC is not actively used. A plurality of power saving modes, such as S0, S1, S2, S3, S4, and S5, are defined in the power saving scheme of the PC99 specification. Among these power saving modes, S0 represents a power on mode. S1 and S2 define different standby modes. S3 represents a suspend to RAM (STR) mode in which data required to reactivate the PC is stored in the RAM of the PC. S4 represents a suspend to disk (STD) mode in which data required to reactivate the PC is stored in the hard disk of the PC. S5 represents a power off mode.

The achieve the power saving function, the design of the motherboard circuit and the basic input and output system (BIOS) have to be involved. FIG. 3 shows a block diagram of a conventional power saving circuit implemented in a motherboard. As shown, this circuit comprises a voltage adjustment circuit 31, a first switch circuit 32, a second switch circuit 33, and a switch control circuit 34. The voltage adjustment circuit 31 is provided to convert a 5V standby voltage of a power supply (not shown) into a 3.3V standby voltage for being applied to the input of the first switch circuit 32. The input of the second switch circuit 33 is connected to a 3.3V working voltage of the power supply. The switch control circuit 34 generates two complementary switch control signals for the first switch circuit 32 and the second switch circuit 33, respectively, based on the power saving control signal provided by the PC system. As such, when the PC is operating in normal condition, the first switch circuit 32 is off and the second switch circuit 33 is on, such that the 3.3V working voltage of the power supply is output. Conversely, if the PC enters a power saving mode, the first switch circuit 32 is on and the second switch circuit 33 is off, such that the 3.3V standby voltage obtained from the voltage adjustment circuit 31 is output. This 3.3V standby voltage thus supplies a minimum power required for the PC to operate in a power saving mode.

Based on progress of the computer technology and the demand for saving power, the newly manufactured motherboards have to meet the requirement of the PC99 specification that involves the functions of the S0–S5 power saving modes. However, many motherboards fail to pass the PC99 certification test and a message of "The system does not support S4 RTC wake up function, the follow test can't be run" is given. Such a test failure may result from the standby voltage being processed in two stages, that is, sequentially processed by the voltage adjustment circuit 31 and the first switch circuit 32. Therefore, the output voltage is not stable and the timing of the output voltage may not be correct. Accordingly, there is a strong desire to have a novel circuit for the motherboard to support the S4 power saving mode and pass the certification test without modifying the BIOS.

SUMMARY OF THE INVENTION

The object of the present invention is to provide a real-time standby voltage adjustment circuit for supplying a very stable standby voltage when a personal computer enters into a power saving mode.

To achieve the object, the real-time standby voltage adjustment circuit includes: a switch control circuit controlled by a power saving control signal provided by the personal computer for generating a switch signal; a switch device controlled by the switch signal for receiving a working voltage provided by a power supply of the personal computer and selectively outputting the same; a converting control circuit; and an adjustment and switch circuit, wherein, the converting control circuit receives an adjust voltage signal generated by the adjustment and switch circuit and is controlled by the power saving control signal for applying the adjust voltage signal back to the adjustment and switch circuit thereby controlling the adjustment and switch circuit to adjust a standby voltage provided by the power supply for outputting an adjusted standby voltage.

The above and other objects, features and advantages of the present invention will become apparent from the following detailed description taken with the accompanying drawings.

DETAILED DESCRIPTION OF THE PREFERRED EMBODIMENTS

Figure 1:
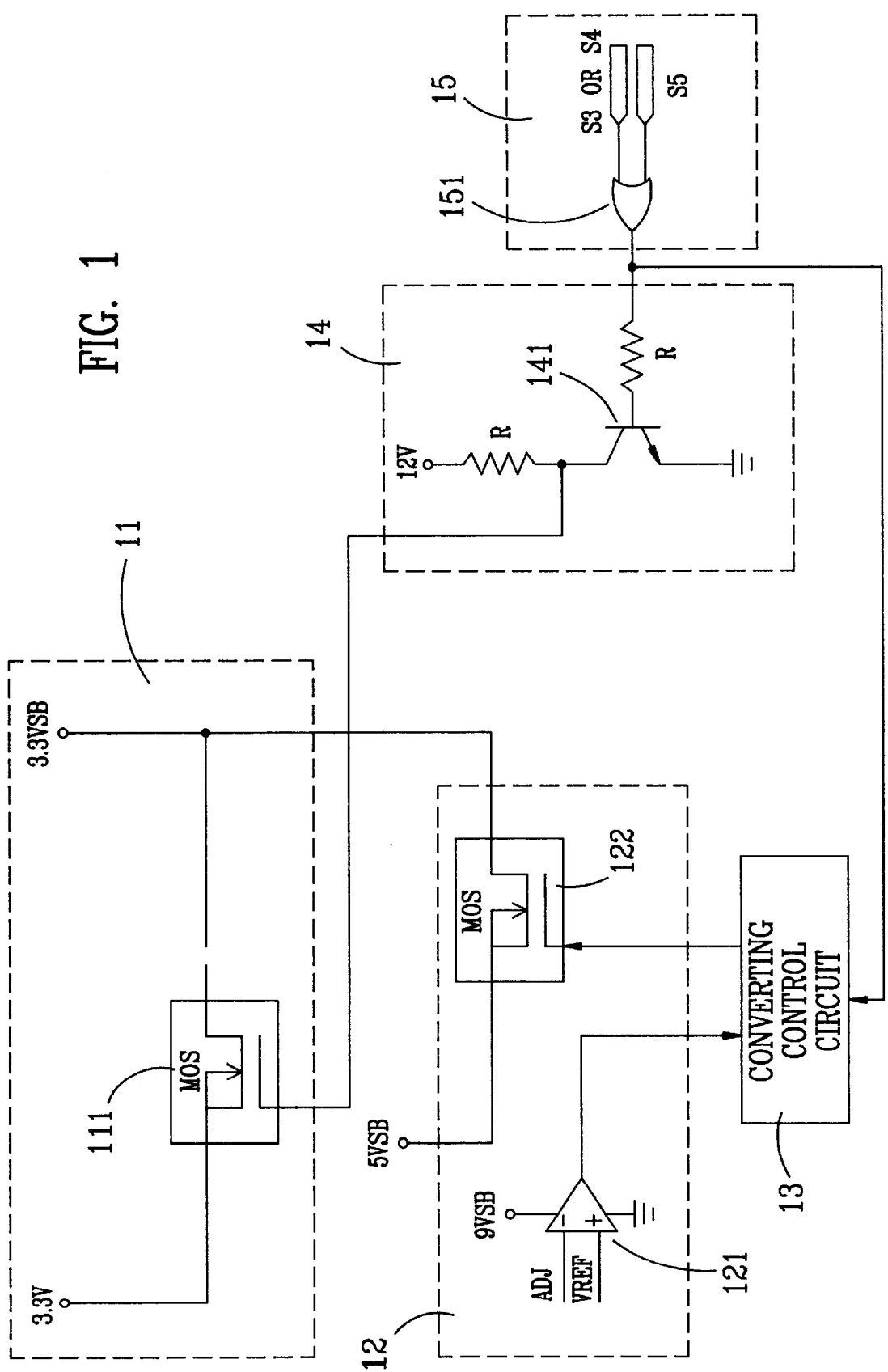
FIG. 1 is a block diagram of a real-time standby voltage adjustment circuit in accordance with the present invention.

Referring to FIG. 1, there is illustrated a real-time standby voltage adjustment circuit in accordance with the present invention, which includes a switch device 11, an adjustment and switch circuit 12, a converting control circuit 13, a switch control circuit 14, and a power saving control signal generation circuit 15. The power saving control signal generation circuit 15 is implemented by a logic OR gate 151 so as to perform a logic operation on the S4 and S5 power saving mode signals or on the S3 and S5 power saving mode signals provided by the PC. Accordingly, a corresponding power saving control signal is generated and presented on the output of the power saving control signal generation circuit 15 to command the motherboard to provide a standby voltage.

The switch control circuit 14 is preferred to be an NPN transistor 141 controlled by the power saving control signal to generate a switch signal. The switch device 11 is preferred to be a metal oxide semiconductor (MOS) transistor 111 controlled by the switch signal to output a 3.3V working voltage provided by a power supply (not shown) of the PC. As such, when the PC is not in power saving mode, the switch device 11 is on so as to support the 3.3V working voltage to the components of the PC.

The adjustment and switch circuit 12 includes an operational amplifier 121 and a MOS transistor 122. The operational amplifier 121 adjusts a feedback voltage ADJ from the MOS transistor 122 to output an adjust voltage signal. The converting control circuit 13 receives the adjust voltage signal, and sends the adjust voltage signal back to the MOS transistor 122 of the adjustment and switch circuit 12 under the control of the power saving control signal, thereby controlling the MOS transistor 122 to adjust a 5V standby voltage provided by the power supply into a 3.3V voltage for output. This 3.3V voltage is thus provided to supply a minimum power required for the PC to operate in a power saving mode.

Figure 2:
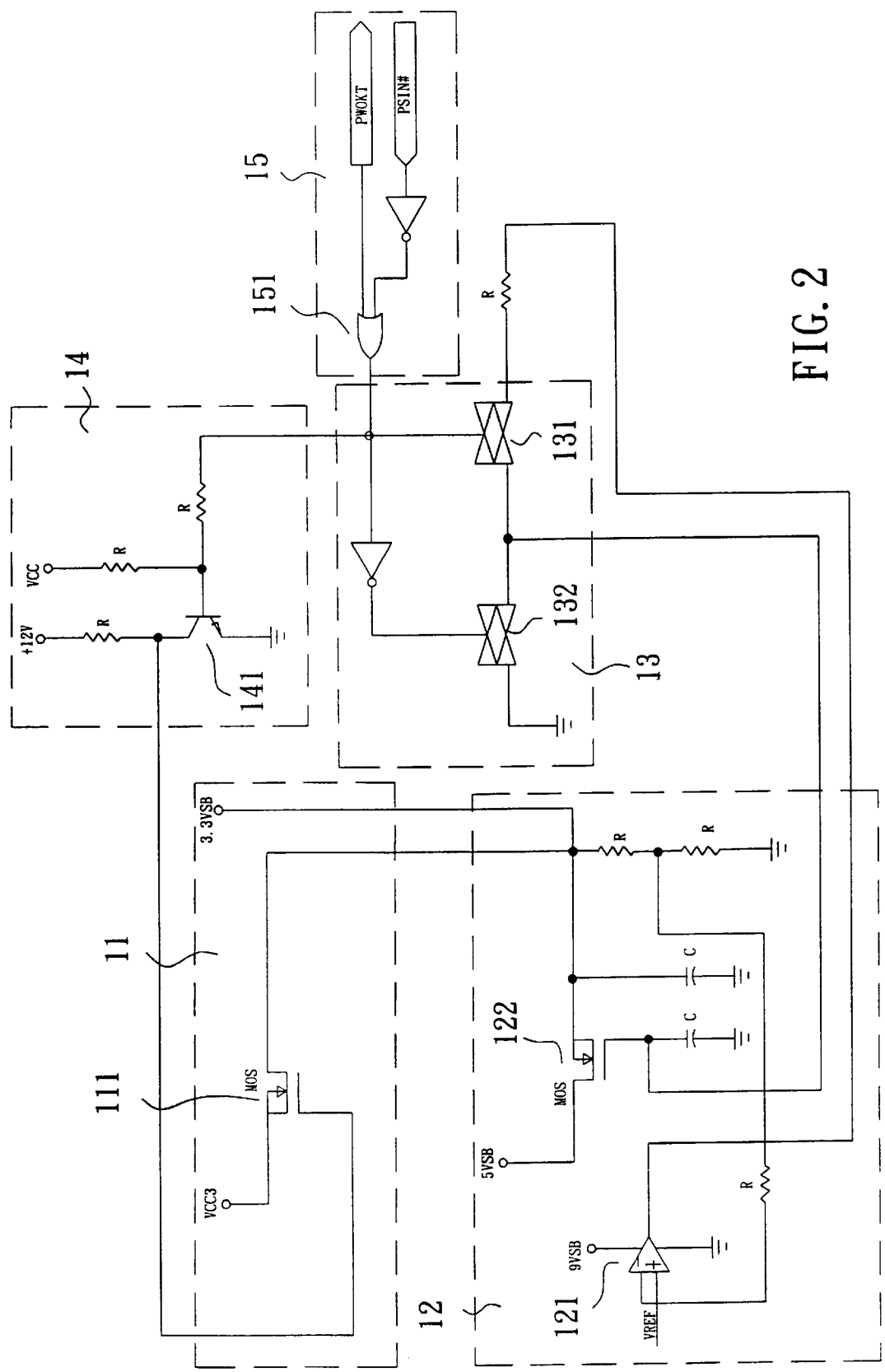
FIG. 2 is a circuit diagram of the real-time standby voltage adjustment circuit in accordance with the present invention.
Figure 3:
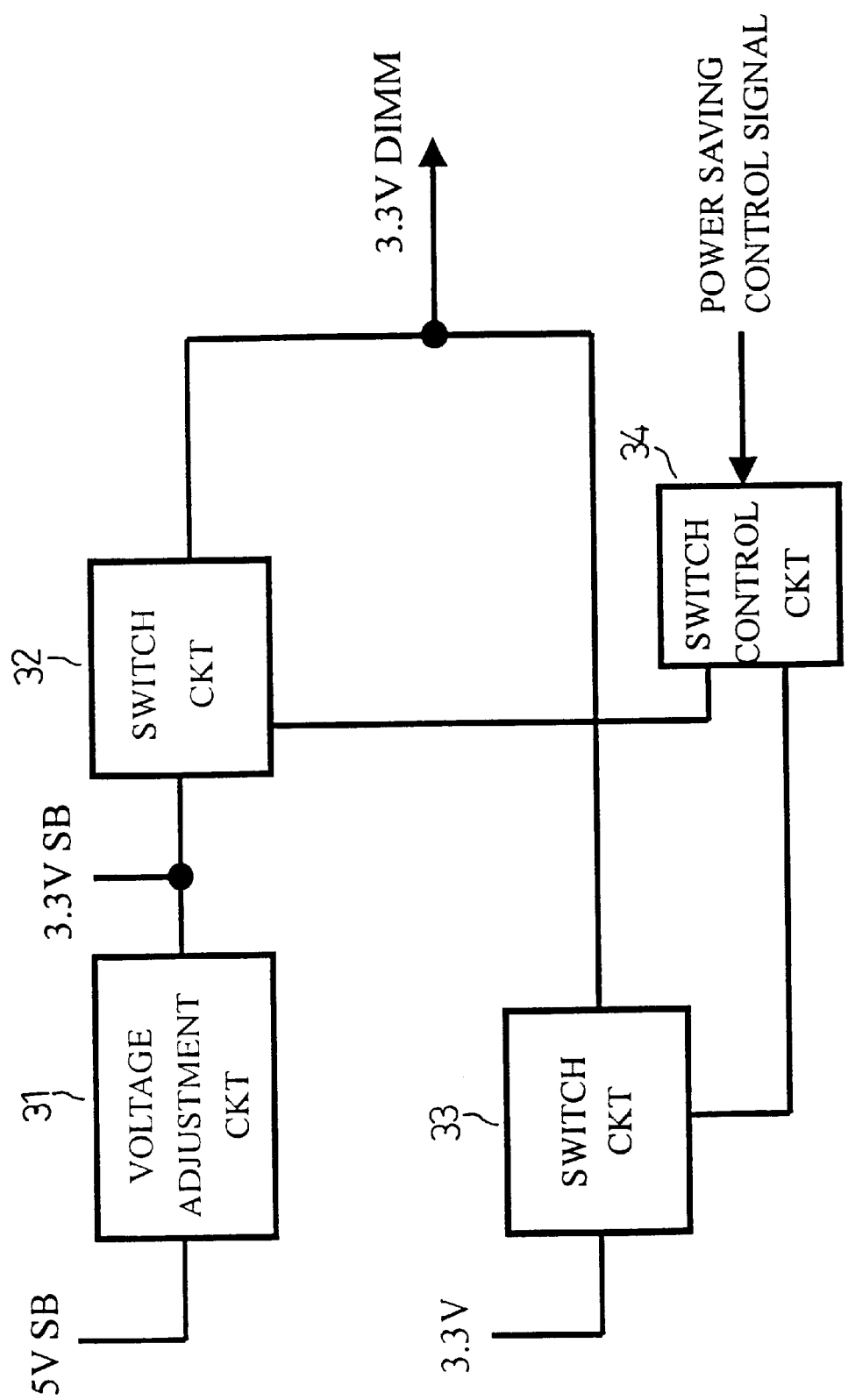
FIG. 3 is a block diagram of a conventional power saving circuit implemented in a motherboard.

FIG. 2 is a circuit diagram of the real-time standby voltage adjustment circuit in accordance with the present invention. As illustrated therein, the converting control circuit 13 is preferably implemented by two converters 131 and 132. The input of converter 131 receives the voltage adjust signal from the adjustment and switch circuit 12. The converter 131 selectively presents the adjust voltage signal on its output to send back to the adjustment and switch circuit 12 under the control of the power saving control signal.

The source of the MOS transistor 111 of the switch device 11 receives the 3.3V working voltage of the power supply. The gate of the MOS transistor 111 is connected to the output of the converter 131 through the switch control circuit 14. The drain of the MOS transistor 111 is thus provided to output the 3.3 working voltage. The base of the NPN transistor 141 of the switch control circuit 14 is provided to receive the power saving control signal. The collector of the NPN transistor 141 is connected to the gate of the MOS transistor 111 of the switch device 11. The emitter of the NPN transistor 141 is connected to ground. The power saving control signal generation circuit 15 generates the S3, S4, and S5 power saving mode signals based on the PWORK and PSIN # signals from the motherboard of the PC.

The source of the MOS transistor 122 of the adjustment and switch circuit 12 receives the 5V standby voltage of the power supply. The gate of the MOS transistor 122 is connected to the output of the converter 131. The drain of the MOS transistor 122 is provided to output the adjusted standby voltage. The inverting and non-inverting inputs of the operational amplifier 121 of the adjustment and switch circuit 12 are connected to a reference voltage VREF and the drain of the MOS transistor 122, respectively, and the output of operational amplifier 121 is connected to the input of the converter 131.

With this circuit structure, the 5V standby voltage of the power supply is simply processed in one stage, that is, processed by the MOS transistor 122 of the adjustment and switch circuit 12 for being output. Furthermore, the voltage adjustment process executed by the adjustment and switch circuit 12 and the circuit switching process executed by the converting control circuit 13 are concurrently performed in an alternative manner. As a result, a very stable standby voltage can be supplied in real time when the PC enters into a power saving mode, and thus the motherboard having this real-time standby voltage adjustment circuit is able to pass the PC99 (Support S4 RTC Wake Up Function) certification test.

While the invention herein disclosed has been described by means of specific embodiments, numerous modifications and variations could be made thereto by those skilled in the art without departing from the scope of the invention set forth in the claims.

What is claimed is:

1. A real-time standby voltage adjustment circuit for outputting a standby voltage required for a personal computer to operate in a power saving mode, comprising:

a switch control circuit controlled by a power saving control signal provided by said personal computer for generating a switch signal;

a switch device controlled by said switch signal for receiving a working voltage provided by a power supply of said personal computer and selectively outputting the working voltage;

a converting control circuit;

an adjustment and switch circuit, wherein, said converting control circuit receives an adjust voltage signal generated by said adjustment and switch circuit and is controlled by said power saving control signal for applying said adjust voltage signal back to said adjustment and switch circuit, thereby controlling said adjustment and switch circuit to adjust a standby voltage provided by said power supply for outputting an adjusted standby voltage; and a common output terminal connected to an output of said switch device and to an output of said adjustment and switch circuit, wherein said working voltage and said adjusted standby voltage are alternatively supplied by said switch device and said adjustment and switch circuit to said common output terminal.

2. The real-time standby voltage adjustment circuit as claimed in claim 1, wherein said converting control circuit comprises a converter having an input for receiving said adjust voltage signal generated by said adjustment and switch circuit, and a first output for selectively outputting said adjust voltage signal to send back to said adjustment and switch circuit based on said power saving control signal.

3. The real-time standby voltage adjustment circuit as claimed in claim 2, wherein said adjustment and switch circuit comprises:

a first metal oxide semiconductor (MOS) transistor having a source for receiving the standby voltage of said power supply, a gate connected to the first output of said converter, and a drain for outputting said adjusted standby voltage; and an operational amplifier having an inverting input for receiving a reference voltage, a non-inverting input coupled to the drain of said first MOS transistor, and an output connected to the input of said converter.

4. The real-time standby voltage adjustment circuit as claimed in claim 3, wherein said switch device is a second MOS transistor having a source for receiving the working voltage of said power supply, a gate connected to the switch signal, and a drain for selectively outputting the working voltage.

5. The real-time standby voltage adjustment circuit as claimed in claim 4, wherein said switch control circuit includes an NPN transistor having a base for receiving said power saving control signal, a collector connected to the gate of said second MOS transistor of said switch device, and an emitter connected to ground.

6. The real-time standby voltage adjustment circuit as claimed in claim 5, wherein said power saving control signal is generated by using a logic OR gate to perform a logic operation on S3 and S4 power saving mode signals provided by said personal computer.

7. The real-time standby voltage adjustment circuit as claimed in claim 5, wherein said standby voltage is 5V and said adjusted standby voltage is 3.3V.

8. The real-time standby voltage adjustment circuit as claimed in claim 5, wherein said working voltage is 3.3V.

* * * * *